United States Patent [19]

Artieri

[11] Patent Number: 5,940,332
[45] Date of Patent: Aug. 17, 1999

[54] PROGRAMMED MEMORY WITH IMPROVED SPEED AND POWER CONSUMPTION

[75] Inventor: Alain Artieri, Mission Viejo, Calif.

[73] Assignee: STMicroelectronics, Inc., Carrollton, Tex.

[21] Appl. No.: 08/969,890

[22] Filed: Nov. 13, 1997

[51] Int. Cl.$^6$ .................................................. G11C 16/04
[52] U.S. Cl. .................. 365/189.08; 365/94; 365/230.03
[58] Field of Search .............................. 365/230.03, 94, 365/189.08; 326/39

[56] References Cited

U.S. PATENT DOCUMENTS

| | | | |
|---|---|---|---|
| 4,760,555 | 7/1988 | Gelsomini et al. | 365/104 |
| 4,928,261 | 5/1990 | Nguyen | 365/104 |
| 5,297,029 | 3/1994 | Nakai et al. | 365/238.5 |
| 5,347,493 | 9/1994 | Pascucci | 365/230.06 |
| 5,377,153 | 12/1994 | Guritz et al. | 365/210 |
| 5,398,210 | 3/1995 | Higuchi | 365/230.03 |
| 5,407,852 | 4/1995 | Ghio et al. | 437/48 |
| 5,513,136 | 4/1996 | Fandrich et al. | 365/185.04 |
| 5,818,786 | 10/1998 | Yoneda | 365/230.03 |

*Primary Examiner*—David Nelms
*Assistant Examiner*—Hien Nguyen
*Attorney, Agent, or Firm*—Theodore E. Galanthay; Lisa K. Jorgenson

[57] ABSTRACT

A memory for storing a reorganizing array of an initial array of data of binary ones and zeros to enable decoding of the reorganized array to reproduce the information content of the initial array, and the method of reorganizing the initial array. The memory includes a data circuit array that has a plurality of memory cells arranged in rows and columns for storing the reorganized array. The memory also has a plurality of flag memory cells and a row of XOR gates and inverters. The initial array is divided into sections. Each row of each section of the initial array that has more ones than zeros is inverted, and the corresponding flag bit is also inverted. Each column of the initial array that has more ones than zeros is inverted, and the corresponding flag bit is also inverted. This is repeated until each row in each section and each column has at least as many ones as zeros, producing the reorganized array. The reorganized array is stored in the data circuit array, and the flag bits corresponding to each row of each section are stored in the flag memory cells. Each XOR gate is connected to one column of the memory cells and to the column of the flag memory cells that correspond to the column of memory cells. An inverter is connected only to the columns whose corresponding flag bit is a one. In an alternative embodiment, the memory contains XOR gates and flag memory columns but not the inverters. In another alternative embodiment, the memory contains inverters but not the XOR gates or flag memory cells. A memory for storing the reorganizing array reduces the number of ones stored in the memory, reducing the memory's power consumption and increasing its access time.

50 Claims, 9 Drawing Sheets

FIG. 4a

|  | $314_1$ | $314_2$ | $314_3$ | $314_4$ |  |
|---|---|---|---|---|---|
| $312_1$ | 1 | 1 | 0 | 0 | —$210_{14}$ |
| $312_2$ | 1 | 1 | 1 | 0 | —$210_{24}$ |
| $312_3$ | 0 | 0 | 1 | 1 | —$210_{34}$ |
| $312_4$ | 0 | 1 | 0 | 1 | —$310_{44}$ |

|  | $314_1$ | $314_2$ | $314_3$ | $314_4$ |  |  |
|---|---|---|---|---|---|---|
| $312_1$ | 1 | 1 | 0 | 0 | 0 | —$318_1$ |
| $312_2$ | 1 | 1 | 1 | 0 | 0 | —$318_2$ |
| $312_3$ | 0 | 0 | 1 | 1 | 0 | —$318_3$ |
| $312_4$ | 0 | 1 | 0 | 1 | 0 | —$318_4$ |
|  | 0 | 0 | 0 | 0 |  | —$320_4$ |

|  | $314_1$ | $314_2$ | $314_3$ | $314_4$ |  |  |
|---|---|---|---|---|---|---|
| $312_1$ | 1 | 1 | 0 | 0 | 0 | —$318_1$ |
| $312'_2$ | 0 | 0 | 0 | 1 | 1 | —$318_2$ |
| $312_3$ | 0 | 0 | 1 | 1 | 0 | —$318_3$ |
| $312_4$ | 0 | 1 | 0 | 1 | 0 | —$318_4$ |
|  | 0 | 0 | 0 | 0 |  | —$320_4$ |

|  | $314_1$ | $314_2$ | $314_3$ | $314'_4$ |  |  |
|---|---|---|---|---|---|---|
| $312_1$ | 1 | 1 | 0 | 1 | 0 | —$318_1$ |
| $312'_2$ | 0 | 0 | 0 | 0 | 1 | —$318_2$ |
| $312_3$ | 0 | 0 | 1 | 0 | 0 | —$318_3$ |
| $312_4$ | 0 | 1 | 0 | 0 | 0 | —$318_4$ |
|  | 0 | 0 | 0 | 1 |  | —$320_4$ |

|  | $314_1$ | $314_2$ | $314_3$ | $314'_4$ |  |  |
|---|---|---|---|---|---|---|
| $312'_1$ | 0 | 0 | 1 | 0 | 1 | —$318_1$ |
| $312'_2$ | 0 | 0 | 0 | 0 | 1 | —$318_2$ |
| $312_3$ | 0 | 0 | 1 | 0 | 0 | —$318_3$ |
| $312_4$ | 0 | 1 | 0 | 0 | 0 | —$318_4$ |
| $320_1$— | 0 | 0 | 0 | 1 |  | —$320_4$ |

$320_2$ $320_3$

300''''

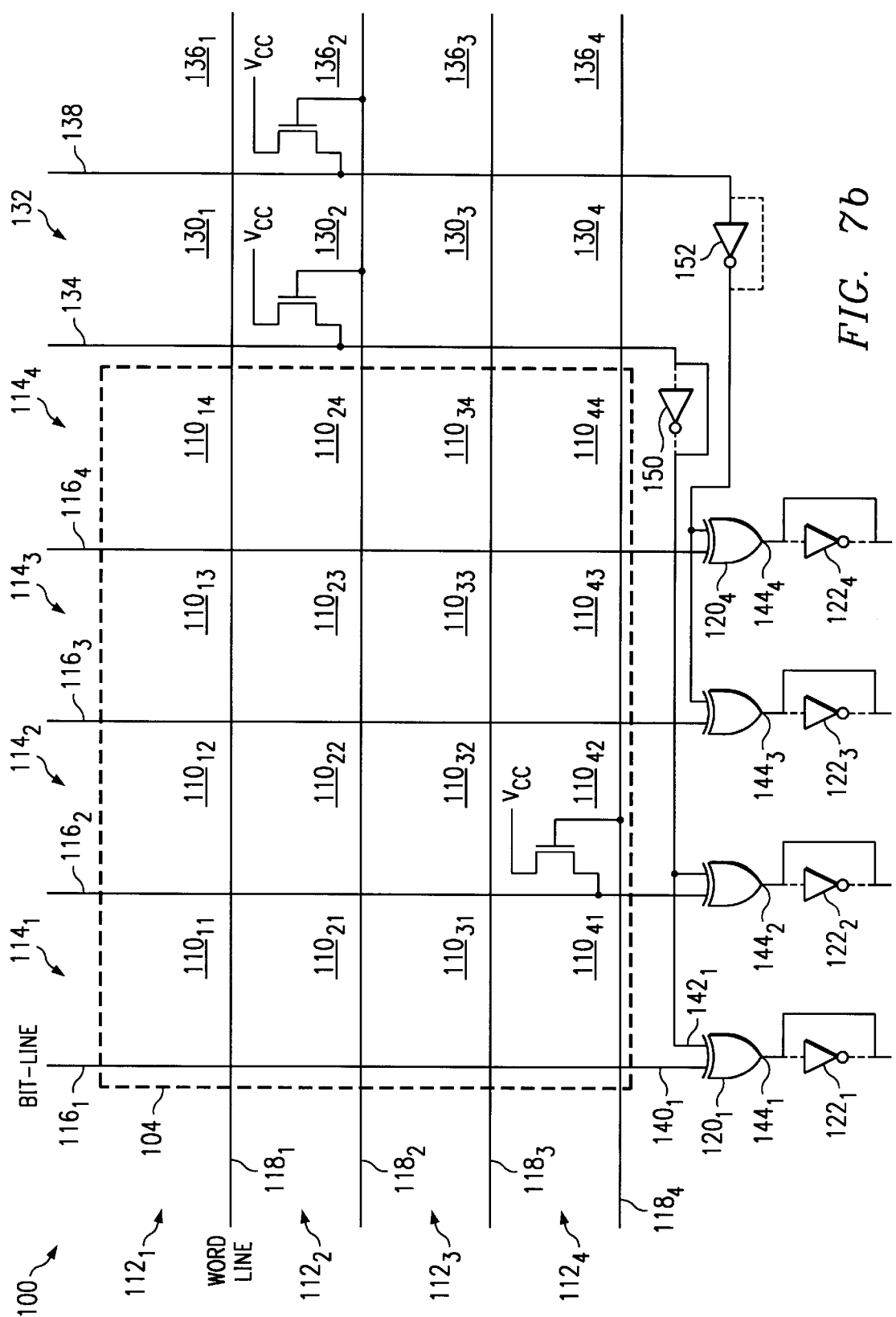

PROGRAMMED MEMORY WITH IMPROVED SPEED AND POWER CONSUMPTION

BACKGROUND

The present invention is related to a memory for storing a data array, and is more specifically related to a programmable memory architecture, and a method of reorganization of stored data for enhanced memory performance.

Read only memories (ROMs) are used to store customized data in an array for retrieval in a user's application. Examples include operating systems in programmable devices such as computers, programs in game cartridges for game consoles, tables for table-look up in applications such as encoders and decoders, code conversion applications as performed by compilers, and other applications where some customized data that will not change with use of the application is needed for the operation of the application.

Referring to FIG. 1a, a ROM array 8 consists of a plurality of memory cells $10_{11} \ldots 10_{44}$ arranged in rows $12_1 \ldots 12_4$ and columns $14_1 \ldots 14_4$. Each memory cell in a column is coupled to a bit-line $16_1 \ldots 16_4$ consisting of a bit-line true and bit-line complement. The content of the memory cells is read through the bit-lines $16_1 \ldots 16_4$. Each memory cell in a row is coupled a word line $18_1 \ldots 18_4$ used to select the appropriate cell in memory to be read. ROM memory cells $10_{11} \ldots 10_{44}$ are generally composed of a single n-channel or p-channel transistor. Typically, the data in the array is known when the ROM is being manufactured. The memory cells $10_{11} \ldots 10_{44}$ contain a transistor connected to the bit-line $16_1 \ldots 16_4$ and word line $18_1 \ldots 18_4$ for the memory cell when the memory cell (e.g., $10_{21}$, $10_{22}$, $10_{23}$, $10_{33}$, $10_{34}$, $10_{42}$, $10_{44}$) corresponds to a bit having the logic state of one in the data array. When the memory cell (e.g., $10_{11}$, $10_{12}$, $10_{13}$, $10_{14}$, $10_{24}$, $10_{31}$, $10_{32}$, $10_{41}$, and $10_{43}$) corresponds to a zero in the data array, no transistor is manufactured in the memory cell.

From a point of view of management of customer's orders and production, it may be advantageous to be able to program the ROM memories as late as possible in the manufacturing process. Referring to FIG. 1b, programming the ROM 20 late in the manufacturing process can be accomplished by manufacturing the ROMs such that each memory cell $30_{11} \ldots 30_{44}$ contains a transistor and either not connecting the transistor to the bit-line $36_1 \ldots 36_4$ and word line $38_1 \ldots 38_4$ associated with transistor's memory cell or disabling the transistor such that the transistor is made permanently non-conductive. One such method of manufacturing a transistor in every memory cell $30_{11} \ldots 30_{44}$ and then not connecting it to the bit-lines $36_1 \ldots 36_4$ is described in U.S. Pat. No. 5,407,852 entitled "Method of Making NOR-Type ROM with LDD Cells" by Ghio et al. assigned to SGS-THOMSON Microelectronics, S.r.l., and incorporated herein by this reference.

Both of the above options are common in the manufacture of ROMs, each providing advantages and disadvantages. Since the manufacturing process can take between four and twelve weeks, programming the ROMs at the end can allow a shortening of the cycle time for the customer by having the ROMs near completion leaving only the need to program the ROM with the data. Being able to program the ROMs at the end of the manufacturing process also allows the data to be changed shortly before the ROMs are completed, permitting the customer the flexibility of changing the data array until shortly before the completion of the manufacturing process of the ROM. However, programming the ROMs at the end of the manufacturing process requires additional cost in manufacturing a transistor at every memory cell and typically can lengthen the manufacturing process, and therefore cycle time for the customer when the ROMs are not pre-prepared. This is due to additional manufacturing steps required to only connect some of the memory cells to the bit-lines and word lines or to disable the transistors so they are non-conductive.

The power consumption of the ROM is directly dependent on the number of ones in the corresponding data array. A transistor in a memory cell consumes power because of the gate capacitance and discharge of the bit-line through the transistor.

Additionally, the access time for a memory cell increases as the number of ones in the row the memory cell is in increases, and increases as the number of ones the column the memory cell increases. The worst access time is for a memory cell at the crossing of a row and column with the largest numbers of ones.

Each custom application using a ROM requires a minimum operating speed for the ROM. Typically, it is more economical to pre-prepare the ROM for the widest application and then custom program it for each individual customer application. The basic circuit must have a speed capability sufficiently fast for that of the most demanding customer part. The power consumption of most parts, including ROMs, increases as the speed increases, so the power consumption of the faster ROM is higher than the power consumption of the ROM needed for the application.

When the ROM circuits are tested, those circuits that do not meet this minimal speed requirement of the most demanding customer part cannot be used for any purpose and therefore must be discarded. This can constitute a substantial overhead expense for the manufacturer of ROM circuits. Since the economies of manufacturing are geared for one basic manufacturing process, all of the customers must receive the same basic ROM, but with customized data. Therefore, many of the customers receive parts that operate at a much higher speed and consume much more power than they require, since the custom design of parts for optimum speed and power is not economically justifiable for the manufacture of relatively low volume custom parts.

SUMMARY OF THE INVENTION

A memory for storing a reorganized data array of an initial data array of binary data of ones and zeros, and for storing flag data to enable decoding of the reorganized array to reproduce the information content of the initial array, and a method for programming the memory is produced in accordance with the present invention. The memory includes a data circuit array that has a plurality of memory cells arranged in rows and columns for storing the reorganized array. The memory also has logic circuitry coupled to the data circuit array to enable reading of the reorganized array from the memory to reproduce the information content of the initial array, output circuitry for reading the data from the data circuit array, and address circuitry for sequentially addressing memory cells to read data from the memory.

In accordance with the method of operation of the present invention, an initial array of data represented by ones and zeros is provided and encoded to provide a reorganized array that has fewer ones than zeros. Flag data to enable decoding of the reorganized array to reproduce the information content of the initial array is recorded. The reorganized array is stored in the data circuit array and the flag data is stored in the logic circuitry, which is interconnected with the data circuit array and the output circuitry based on the flag data.

The novel features believed characteristic of the invention are set forth in the appended claims. The nature of the invention, however, as well as its features and advantages, may be understood more fully upon consideration of illustrative embodiments when read in conjunction with the accompanying drawings, wherein:

BRIEF DESCRIPTION OF THE DRAWINGS

FIG. 4a is a representation of a second data array.

FIG. 4b shows the data array of FIG. 4a with an additional column and an additional row of flag bits.

FIG. 4c shows the data array of FIG. 4b after the row inversion step.

FIG. 4d shows the data array of FIG. 4c after a column inversion step.

FIG. 4e shows the data array of the FIG. 4d after a second row inversion step, which is also a representation of a fully reorganized array.

FIG. 5a is a circuit diagram of a memory storing the initial array in FIG. 4a.

FIG. 7a is a circuit diagram of a memory storing the initial array in FIG. 6a.

FIG. 7b is a circuit diagram of a memory according to an embodiment of the present invention, storing the reorganized array in FIG. 6d.

Parts common to FIGS. 1 through 7 are indicated using the same numbering system.

DESCRIPTION OF THE PREFERRED EMBODIMENTS

Figure 2A:
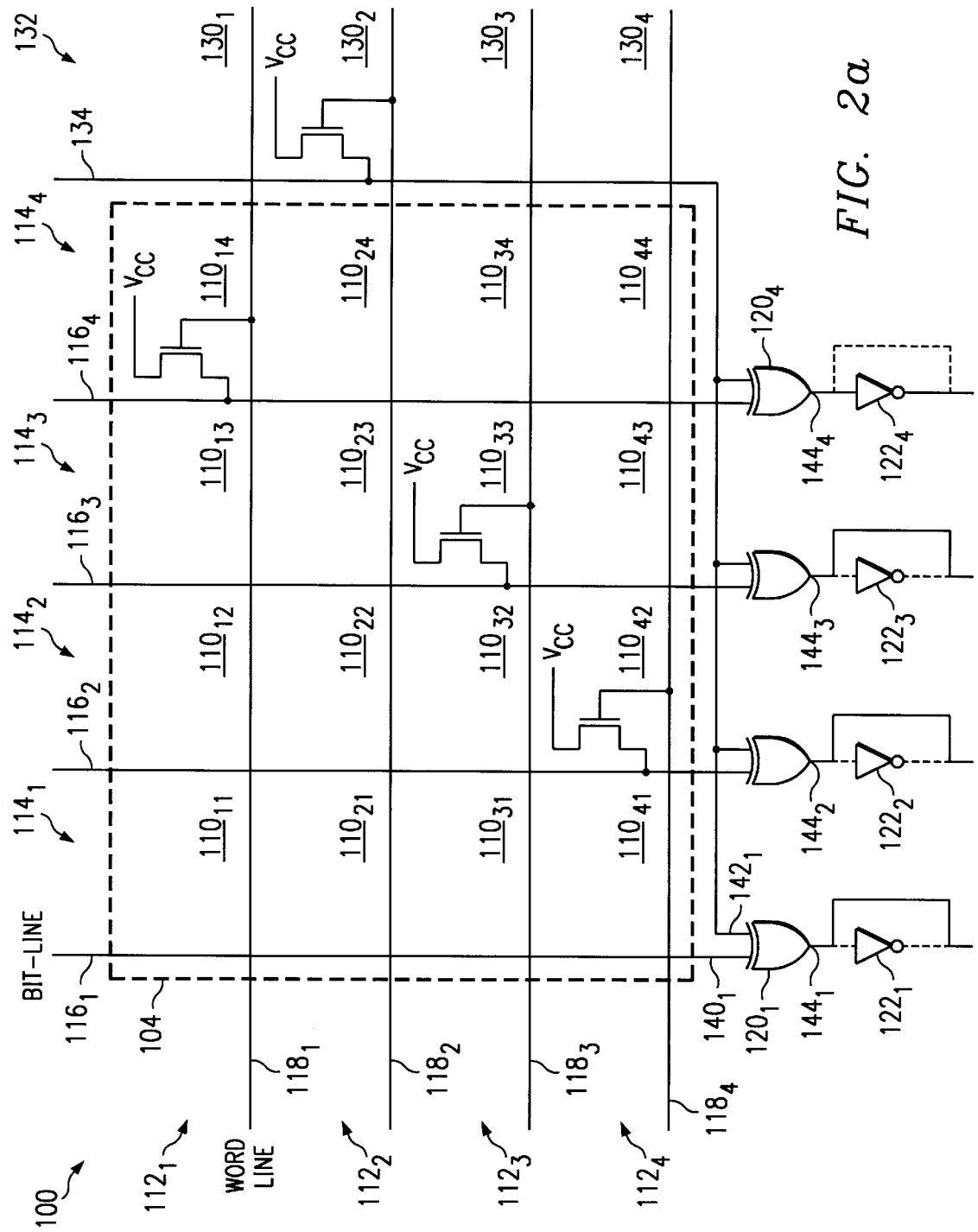
FIG. 2a is a circuit diagram of a memory according to an embodiment of the present invention with only the memory cells that store a one containing transistors.
Figure 3A:
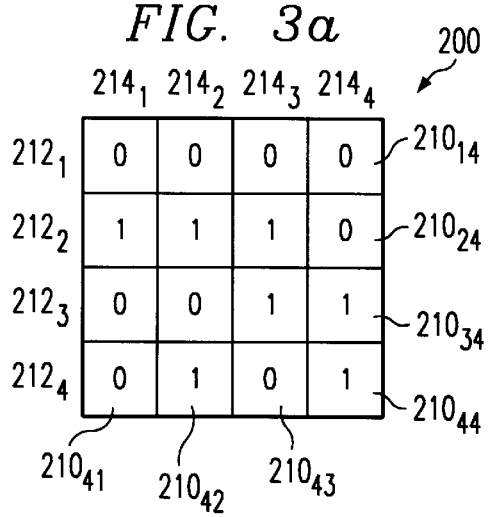
FIG. 3a is a representation of an initial array stored in the memory of FIGS. 1a and 1b.
Figure 3B:
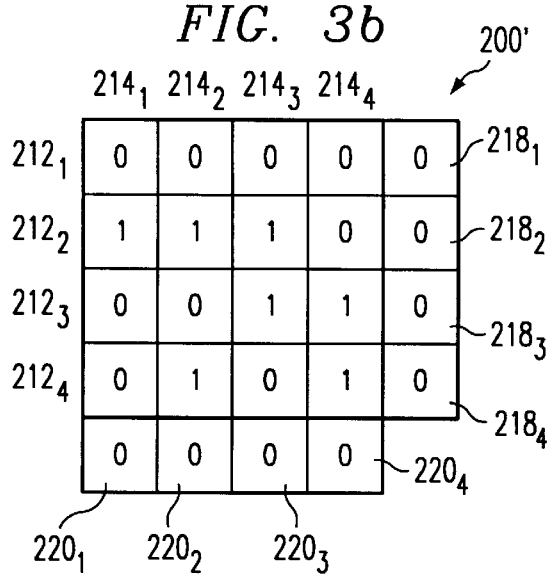
FIG. 3b shows the data array of FIG. 3a with an additional column and an additional row of flag bits.

Referring to FIG. 2a, a memory according to an embodiment of the invention is designated generally by reference numeral 100. The memory 100 is for storing data content of an initial array 200, such as shown in FIG. 3a, once it is reorganized into the reorganized array 200''', shown in FIG. 3d. The initial array 200 has data cell bits $210_{11} \ldots 210_{44}$ of ones and zeros arranged in rows $212_1 \ldots 212_4$, and columns $214_1 \ldots 214_4$. The memory 100 is a programmable memory, such a ROM, EPROM, EEPROM, or even a programmable logic array (PLA), or any other memory that can be used in to applications where specific customized data, typically in the form of a data array, is required for the operation of the application and the data array will not change with the use of the application. The memory 100 can be used in any application where the above memories are used, such as computers, game cartridges, encoders, and decoders.

Figure 3C:
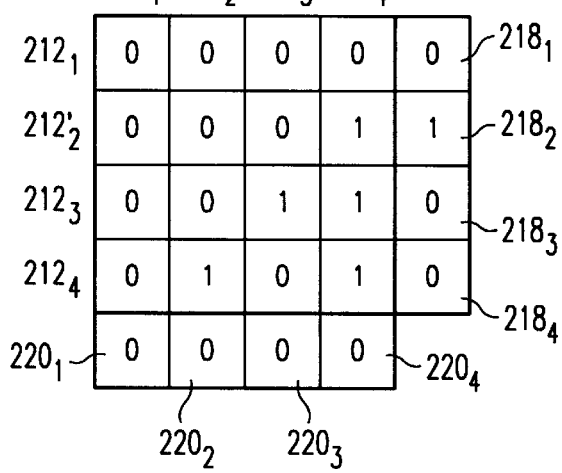
FIG. 3c shows the data array of FIG. 3b after a row inversion step.
Figure 3D:
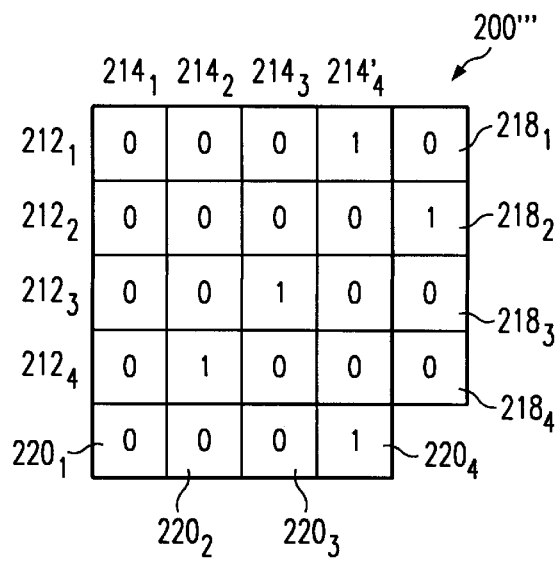
FIG. 3d shows the data array of FIG. 3c after a column inversion step, which is also a representation of a fully reorganized data array.
Figure 5A:
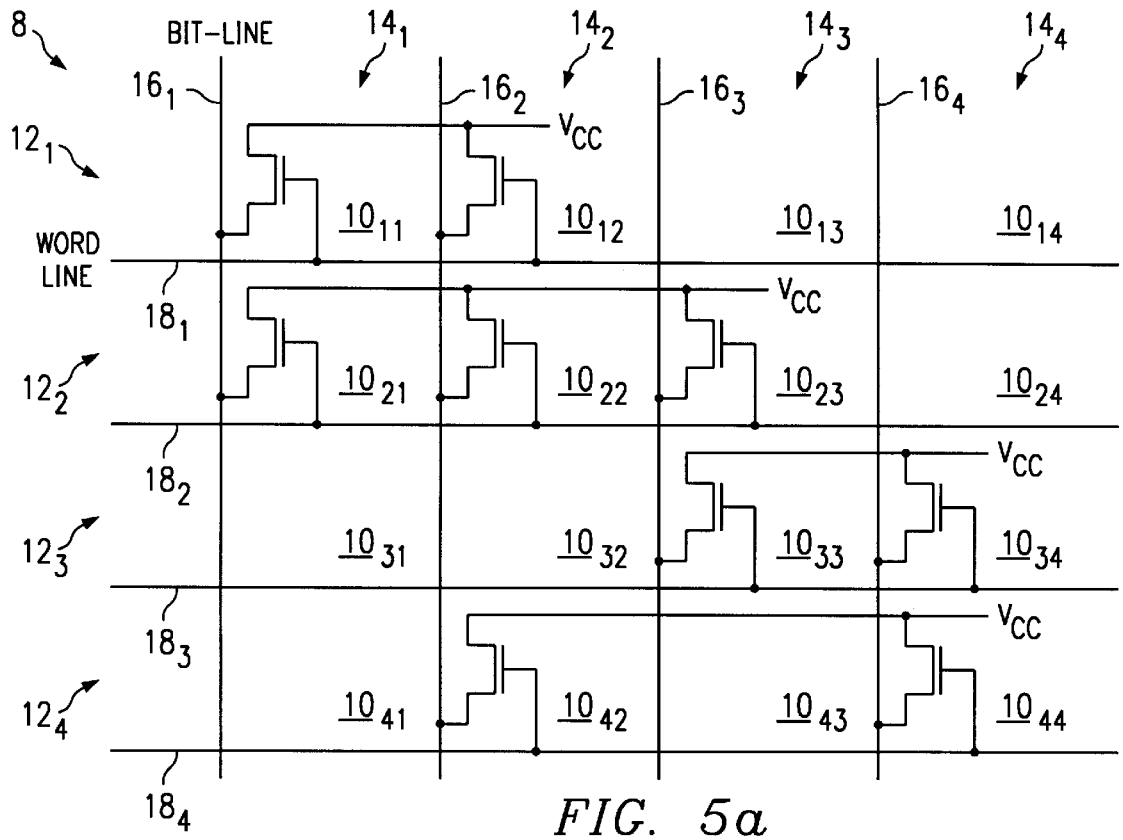
Figure 7A:
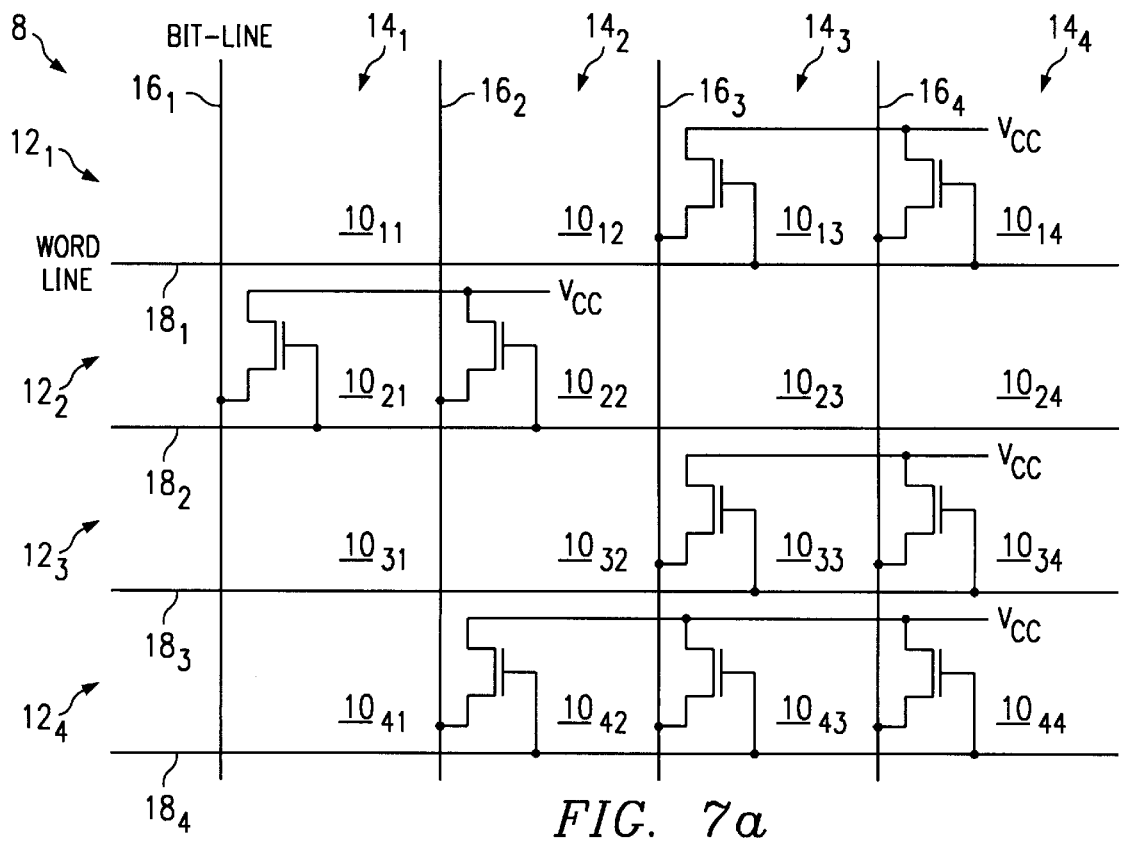
Figure 5B:
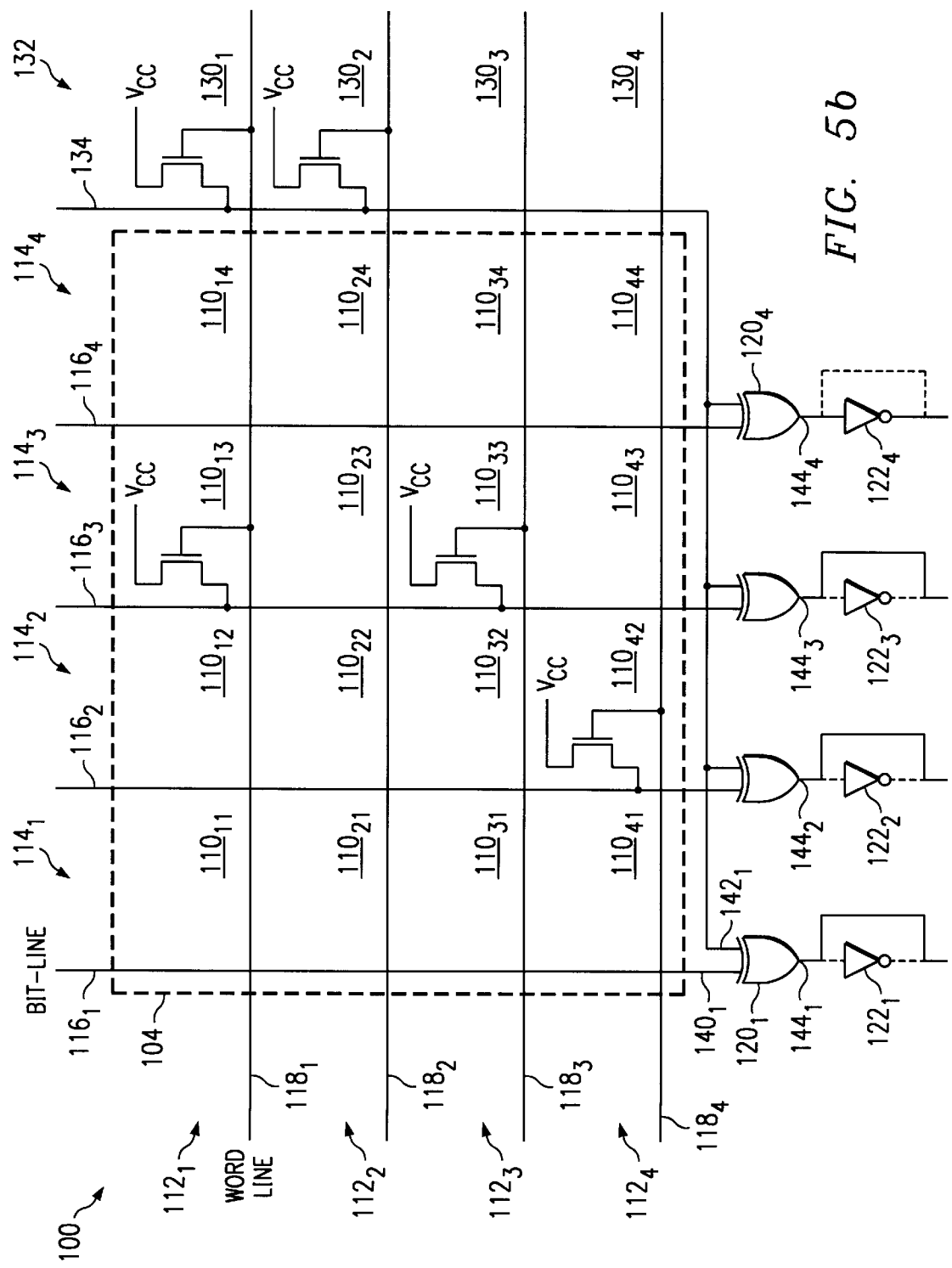
FIG. 5b is a circuit diagram of a memory according to an embodiment of the present invention, storing the reorganized array in FIG. 4e.

Referring to FIG. 2a and 3d simultaneously, the memory 100 has data circuit array 104 that has a plurality of memory cells $110_{11} \ldots 110_{44}$ for storing the data in the reorganized array 200''', output circuitry for reading the data from the data circuit array, and address circuitry for sequentially addressing memory cells to read data from the memory. The memory cells $110_{11} \ldots 110_{44}$ are arranged in rows $112_1 \ldots 112_4$ and columns $114_1 \ldots 114_4$. Although only four rows and columns of data cells, and 16 bits are shown many more can be and typically used in the data array; and although only four rows and columns of the data circuit array, and sixteen memory cells are shown many more can, and typically are, used in the memory.

The memory also contains logic circuitry to enable the reading of the reorganized array from the memory to reproduce the information content of the initial array. The logic circuitry includes a plurality of flag memory cell $130_1 \ldots 130_4$ arranged in rows and in one or more columns 132, each row corresponding to one memory row $112_1 \ldots 112_4$, and an exclusive OR gate, commonly referred to as an XOR gate, $120_1 \ldots 120_4$. One XOR gate $120_1 \ldots 120_4$ is coupled to one of the memory columns $121_1 \ldots 112_4$. Each of the XOR gates has a first input $140_1 \ldots 140_4$ coupled to one of the memory columns $112_1 \ldots 112_4$, a second input $142_1 \ldots 142_4$ coupled to the flag column, and an output $144_1 \ldots 144_4$. The XOR gates invert the bits in the memory cells responsive to flag data in the corresponding flag memory cell.

The logic circuitry also includes a row of inverters $122_1 \ldots 122_4$ The inverters are selectively coupled to the columns of the data circuit array when the flag data corresponding to the column is a one. As described below, in one embodiment of the invention, the input of the inverter circuit is connected to the output $144_1 \ldots 144_4$ of the XOR gate corresponding to the column in the data circuit array to which the inverter is connected. In another embodiment of the invention, the inverters $122_1 \ldots 122_4$ are connected between the column of the data circuit array and the first input $140_1 \ldots 140_4$ of the XOR gate.

The output circuitry contains a plurality of bit-lines $116_1 \ldots 116_4$, and the address circuitry contains a plurality of wordlines $118_1 \ldots 118_4$. The bit-lines $116_1 \ldots 116_4$ are used to read the contents of the memory cells $110_{11} \ldots 110_{44}$. The wordlines are used to select the appropriate memory cell $110_{11} \ldots 110_{44}$ to be read. All of the memory cells in one memory column that are going to be coupled to a bit-line are coupled to one bit-line. Typically there is one bit-line $116_1 \ldots 116_4$ for every memory column $114_1 \ldots 114_4$, however each bit-line $116_1 \ldots 116_4$ can be used to read the data from multiple memory columns as described in U.S. Pat. No. 5,377,153 entitled "Method of Making NOR-Type ROM with LDD Cells" by Guritz et al. assigned to SGS- THOMSON Microelectronics, Inc., and incorporated herein by this reference, allowing fewer bit-lines to be used to access the data in the memory cells $110_{11} \ldots 110_{44}$.

Figure 2B:
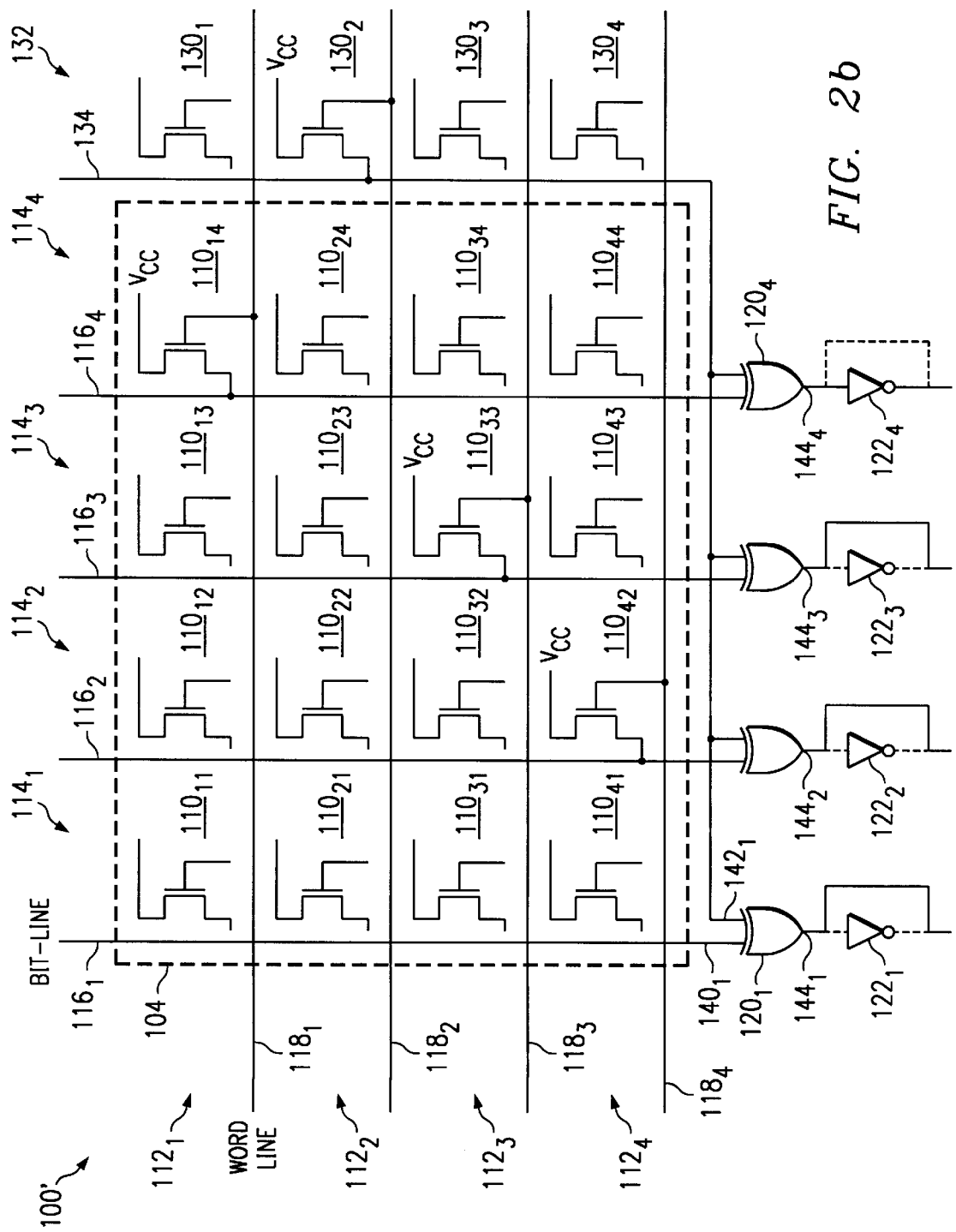
FIG. 2b is a circuit diagram of a memory according to an embodiment of the present invention with all of the memory cells containing transistors.

Memory cells $110_{14}$, $110_{33}$, $110_{42}$ that store a one contain a transistor coupled to the bit-line. The rest of the memory cells do not have a transistor manufactured in those cells as shown in FIG. 2a, or more likely, as shown in FIG. 2b, have a transistor that is not connected to the bit-line, or have a transistor that is disabled such that it is permanently non-conductive. If the memory is to be pre-prepared than every memory cell will have a transistor but only the memory cells that store ones will be connected to bit-lines. If the memory is custom manufactured for the data array and is completely manufactured after the data array is available, the memory cell that will store zeros will not have transistors manufactured in them at all.

The output circuitry also contains a flag bit-line 134. All of the flag memory cells in one column of flag memory cells that are going to be coupled to a bit-line are coupled to one flag bit-line. The data in the flag memory cells is read through the flag bit-lines. Each flag memory cell storing a one 1302 has a transistor coupled to the flag bit-line 134.

Having both (1) the flag memory cells and XOR gates, and (2) the inverters allows the memory to store a reorganized array that has much fewer ohes than the initial array. Alternatively, the memory can have either the flag memory cell and XOR gate, or the inverters. This will still allow the memory to store a reorganized array that has fewer ones than the initial array, but in most cases more ones than a data array that can be stored in a memory with both (1) the flag memory cells and XOR gates, and (2) the inverters.

Referring to FIGS. 3a through 3d and FIG. 2a simultaneously, a preferred method making the memory for storing the reorganized array will be described. The initial array 200 is provided, and then encoded to get the reorganized array 200′″ and flag data. The flag data produced in encoding the initial array is recorded. The reorganized array is stored in the data circuit array and the flag data is stored in the flag memory cells. The rest of the logic circuitry is connected to the data circuit array based on the flag data.

A row of column logic cells $220_1 \ldots 220_4$ is identified for storing the flag data produced in encoding each of the columns of initial array. A column of row logic cells $218_1 \ldots 218_4$ is identified for storing the flag data produced in encoding each of the row of the initial array. Preferably, the data cell of the column logic cells $220_1 \ldots 220_4$ and of the row logic cells $218_1 \ldots 218_4$ are initially set to zero.

To encode the initial array in each row that has more ones than zeros, such as row $212_2$, invert the ones and zeros to get row $212'_2$, as shown in FIG. 3c. The flag data for the row is inverted and recorded in the data cell of the row logic cell $218_2$ corresponding to the row. Then, in each column that has more ones than zeros $214_4$ invert all of the bits in the column $214_4$, as shown in FIG. 3d. The flag data for the column is inverted and recorded in the data cell of the column logic cell $220_4$ corresponding to the column.

If after one iteration of the inverting and recording the flag data all of the data row sections and data columns have at least as many zeros as ones, as in FIG. 3d, then store each bit in the corresponding memory cell, store each flag bit in the corresponding flag memory cell and connect the column $144_4$ of the data circuit array storing a column of the reorganized array corresponding to a column logic cell that has a one to an inverter $122_4$. Otherwise, the inverting and recording steps are repeated until each row and each column has at least as many zeros as ones before the data is stored in the memory and the inverters are connected. One iteration of the encoding and recording is performed on the initial array provided in FIG. 4a to produce the array in FIG. 4d. For each row $312_1$ that has more ones than zeros invert the data in the row $312_1$, invert the flag bit corresponding to the row and record the flag data in the row logic cell $318_1$ corresponding to the row, as shown in FIG. 4e. Then, for each column that has more ones than zeros invert the data in the column and the flag data for the column, and record the flag data in the data cell of the column logic cell corresponding to the column. Repeat these steps until all of the rows and all of the columns have at least as many zeros as ones. Then store each datum in the corresponding memory cell and store each flag bit in the corresponding flag memory cells and connect the inverters. The memory of the present invention, shown in FIG. 5b, contains far fewer transistors than the memory that containing the initial array, shown in FIG. 5a.

The order of checking and inverting the rows and columns can be reversed, the columns can be checked and inverted first and then the rows can be checked and inverted. When the order is reversed the inverters $122_1 \ldots 122_4$ should be coupled between the columns of the data circuit array $114_1 \ldots 114_4$ and the first input of the XOR gates $140_1 \ldots 140_4$.

Figure 1A:
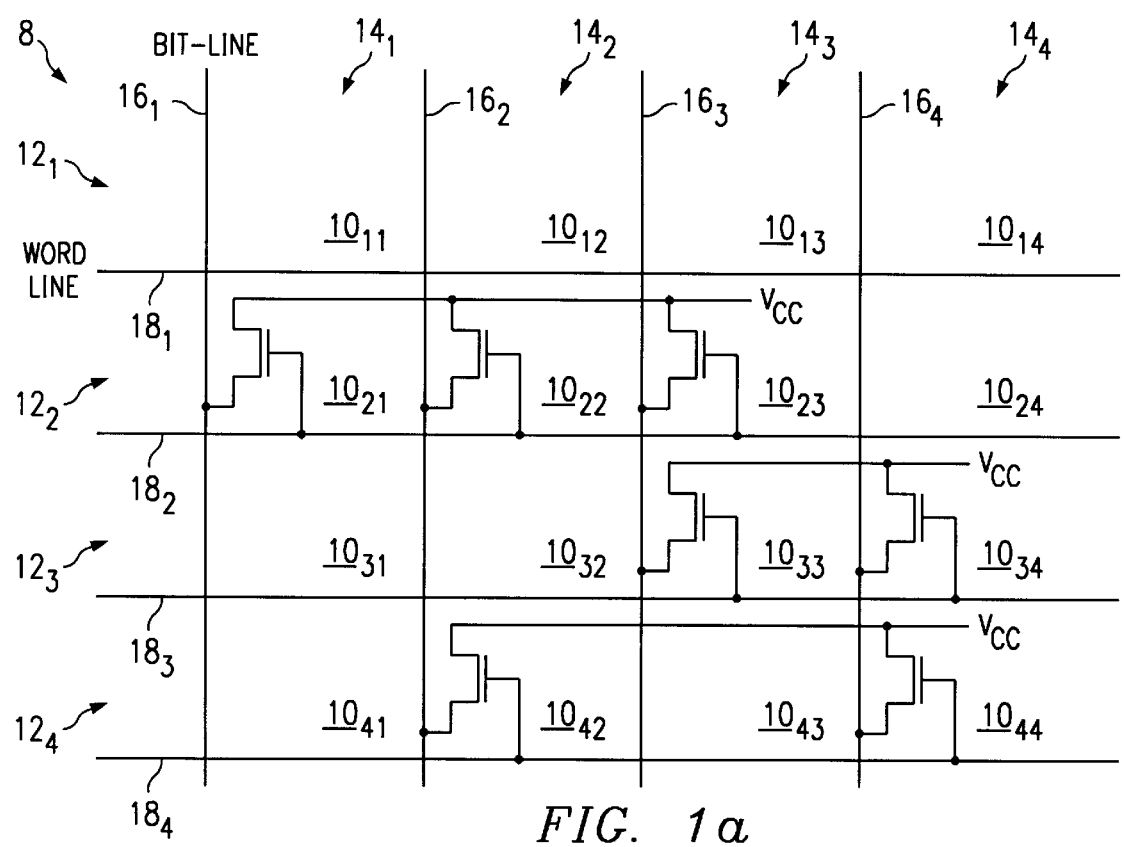
FIG. 1a is a circuit diagram of a conventional memory with only the memory cells that store a one containing transistors.
Figure 1B:
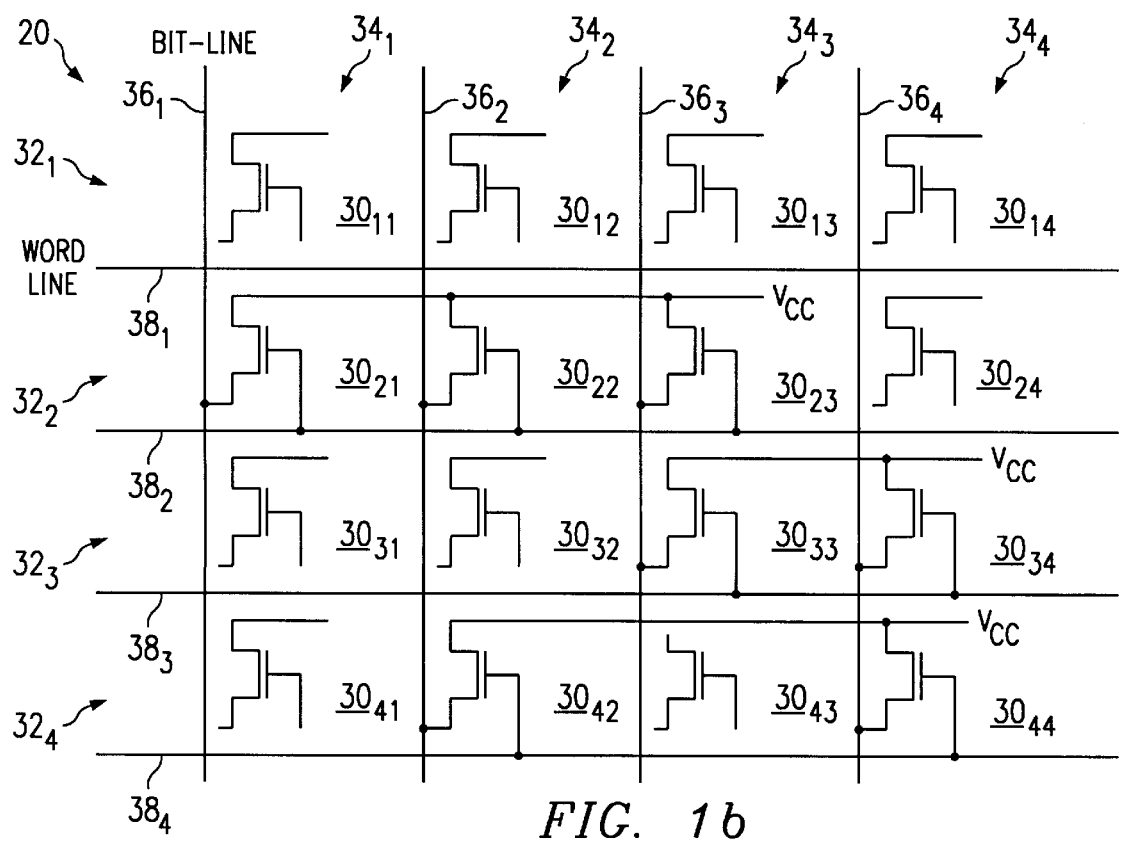
FIG. 1b is a circuit diagram of a conventional memory with all of the memory cells containing transistors.

The initial array 200 of FIG. 3a is shown as stored in memory 8 in FIG. 1a, the reorganized array 200′″ is stored in the memory 100 of FIG. 2a. As can be seen, the memory 100 of the current invention requires far fewer transistors connected to bit-lines than conventional memory 8. For the initial array 200 of FIG. 3a, the reorganization has reduced the number of ones by more than half, therefore less than half as many transistors connected to bit-lines are needed with the memory 100 of the invention then were needed with a conventional memory 8. This allows the memory 100 of the current invention to draw much less power since the power consumption of the memory is proportional to the number of ones stored. It also allows the memory 100 of the current invention to have quicker access time to the individual memory cell, because now no row or column has more ones than zeros, and the access time is based on the number of ones in the row and the column of the memory cell.

In alternative embodiments of the invention, memory 100 can contain just the flag memory cell and XOR gates or just the inverters. When the memory contains flag memory cell and XOR gates but not inverters, the reorganized array is produced by just inverting the data in each of the rows of the initial array having more ones than zeros. When the memory contains inverters but not the flag memory cells and XOR gates, the reorganized array is produced by just inverting the data in each of the columns of the initial array that has more ones than zeros.

All of the encoding and recording are preferably preformed by software and the reorganized array is then input into a ROM generator to generate the layout of the memory.

Referring to FIG. 6a–6d, in an alternate embodiment of the invention the initial array 600 can be reorganized to have even fewer ones if the initial array is divided into sections 630, 632. Each section contains a certain number of data columns, such that each of the rows is divided along these sections, producing data row sections $626_1 \ldots 626_4$ and $628_1 \ldots 628_4$. The sections $626_1 \ldots 626_4$, and $628_1 \ldots 628_4$ can be any size. Each section in a row can contain a different number data cell, for example one section of one row can have three data cells and another can have five data cells.

However, since the sections are produced by dividing the array into columns, the respective sections will have the same number of data cells in every row, for example the $X^{th}$ section $626_{row\#X}$ of each row will have the same number of data bits.

If the initial array does not need to be divided up to be reorganized, such as the initial arrays in FIG. 3 and 4 described above the initial array has just one section, and the sections of each row are the rows, respectively.

The columns in the sections do not have to be adjacent. For example, a section can contain data in the first, third and fourth columns, but not in the second column.

Referring to FIGS. 6a–6d and 7b simultaneously, one column of row logic cells is provided for each section of the initial array, such that row logic cell corresponds to one section of the row of the initial array. Therefore, there is one column of row logic cells $634_1$ . . . $634_4$ corresponding to one section 630 and another column of row logic cells $636_1$ . . . $636_4$ corresponding to another section 632. The flag memory cells are also arranged in rows, one row of flag memory cells $132_1$ . . . $132_4$ and $136_1$ . . . $136_4$ for each section of the initial array to store the row logic cells $634_1$ . . . $634_4$ and $636_1$ . . . $636_4$, respectively. Typically, there is one flag bit-line 134, 138 for every column of flag memory cells $132_1$ . . . $132_4$ and $136_1$ . . . $136_4$, however just like the bit-lines, each flag bit-line can be used to read the data from multiple flag columns. Each of the flag bit-lines is connected to the second input of the XOR gate that corresponds to the column of the data circuit array that stores the column of the reorganized array to which the flag data corresponds.

Figure 6A:
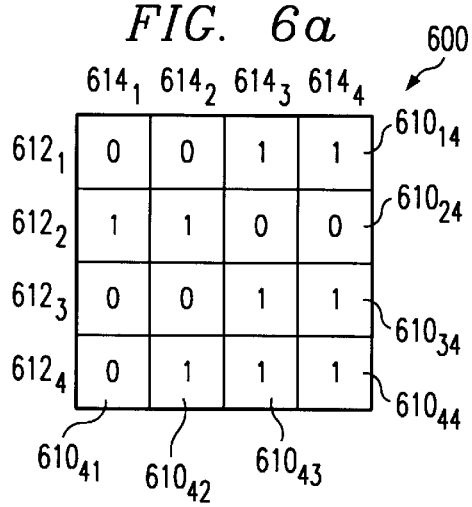
FIG. 6a is a representation of a third initial array.
Figure 6B:
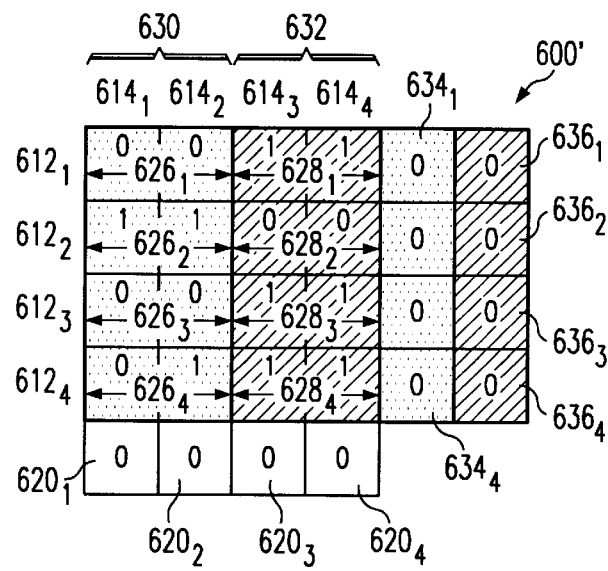
FIG. 6b shows the data array of FIG. 6a divided into sections and with two additional columns and an additional row of flag bits.
Figure 6C:
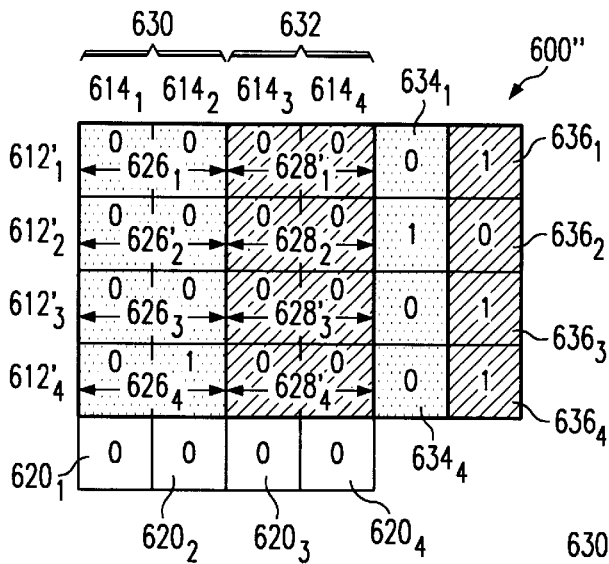
FIG. 6c shows the data array of FIG. 6b after a row inversion step.
Figure 6D:
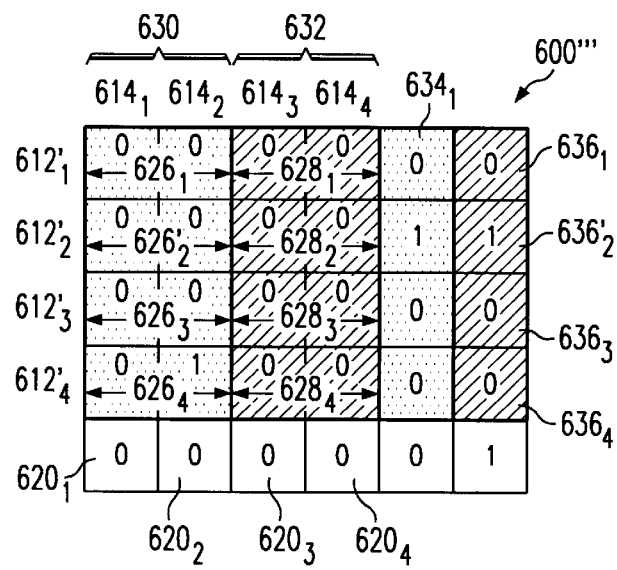
FIG. 6d shows the data array of FIG. 6c after a column inversion step, which is also a representation of a fully reorganized data array.

In operation, an initial array 600, shown in FIG. 6a, is provided. This is initial array is divided into sections 630, 632 each section is encoded in the same manner described above for the encoding of the initial array to get a reorganized array 600''' shown in FIG. 6c, and the flag data produced in encoding is recorded. The reorganized array is stored in the data circuit array and the flag data is stored in the flag memory cells. The rest of the logic circuitry is connected to the data circuit array based on the flag data.

Additionally, inverters 150, 152 can be added to the columns of flag memory cells and the data in each column of flag memory cells $136_1$ . . . $136_4$ that has more ones than zeros can be inverted and the column of flag memory cells $136_1$ . . . $136_4$ connected to the inverter 152.

All of the encoding and recording are preferably preformed by software and the reorganized array is then input into a ROM generator to generate the layout of the memory.

In one embodiment of the invention, the number of section of the initial array and therefore the number of columns of flag memory cells is determined based on logically optimizing the data array to contain the fewest number of ones verses the additional cost of adding a flag column to the memory.

Logically optimizing the data array is done by determining which data columns can be grouped together to produce the smallest number of ones, including the ones that will be needed as flag bits. The columns of the initial array do not have to be adjacent to be grouped together, and each grouping of columns, i.e. each section, does not have to have the same number of columns. This is typically performed in software, and can be performed using any known algorithm to do so, including an exhaustive search. Determining the optimum number of sections and adding the appropriate number of columns of flag memory cells is only possible if the memory is manufactured specifically for the application. If the memory was pre-prepared the number of flag columns would be set and it would not be possible to add additional flag columns.

Alternatively, the number of columns of the flag memory cells can be preset. The number of sections of the initial array is set to the number of flag columns. In this case, reorganizing the initial array is done by determining which columns of the initial array can be grouped together into the available number of sections, or into fewer section, to produce the smallest number of ones, including the ones that will be needed as flag bits. The columns do not have to be adjacent to be grouped together, and each grouping of columns, i.e. each section, does not have to have the same number of columns. This is also typically performed in software, and can be performed using any known algorithm to do so, including an exhaustive search. Having the number of sections predetermined allows the initial array to be reorganized while still allowing the memory to be pre-prepared and programmed toward the end of the manufacturing process, or even to be programmed in the field for memories such as EEPROMs.

A method that allows an initial array to be reorganized by reducing the number of ones in the array, and the memory that is used to store the reorganized array produces a memory with a reduced power consumption for quicker access time. Reducing the number of ones that need to be stored by inverting some of bits and adding circuitry to insure that the bits are read out to generate the information content of the initial array produces a memory that requires far fewer transistors connected to bit-lines than conventional memory. This allows the memory 100 of the current invention to draw much less power since the power consumption of the memory is proportional to the number of one in the array. It also allow the memory 100 of the current invention to have quicker access time to the individual memory cell, because now no row or column has more ones than zeros, and the access time is based on the number of ones in the row and the column of the memory cell.

Although the invention has been specifically described with reference to several preferred and alternative embodiments, it will be understood by those skilled in the art having reference to the current specification and drawings that various modifications may be made and further alternatives are possible without departing from the spirit and scope of the invention as set forth in the appended claims.

I claim:

1. A memory for storing a reorganized array of an initial array of binary data of ones and zeros arranged in columns and rows, each row divided into one or more sections, and for storing flag data to enable decoding of the reorganized array to reproduce the information content of the initial array, the memory comprising:

a data circuit array having a plurality of memory cells for storing the reorganized array, the memory cells arranged in rows and columns;

logic circuitry coupled to the data circuit array to enable reading of the reorganized array from the memory to reproduce the information content of the initial array; and output circuitry for reading the data from the data circuit array; and address circuitry for sequentially addressing memory cells to read data from the memory.

2. The memory of claim 1, wherein the logic circuitry comprises:

a plurality of flag memory cells for storing the flag data, the flag memory cells arranged one or more columns and in rows, there being one column of flag memory cells for each section in one row of the initial array , such that each flag memory cell corresponds to one section of the row of the initial array; and a plurality of XOR gates, one XOR gate coupled to one column of the data circuit array and one column of the flag memory cells.

3. The memory of claim 2, wherein the logic circuit further comprises a plurality of inverters, each inverter selectively coupled to one of the columns of the data circuit array responsive to the flag data.

4. The memory of claim 1, wherein the output circuitry comprises:

a plurality of bit-lines for reading the data in the memory cells, each bit-line coupled to memory cells in one of the columns of the data circuit array, each memory cell storing a one has a transistor coupled to the bit-line;

one flag bit-line for each column of flag memory cells, each flag bit-line coupled to flag cells in one column of the flag memory cells for reading the flag data, each flag memory cell storing a one has a transistor coupled to the flag bit-line.

5. The memory of claim 1, wherein one section of one of the rows of the initial array consist of the number of bytes in a word of the memory.

6. The memory of claim 1, wherein one section of one of the rows of the initial array consist of the entire row of the initial array.

7. The memory of claim 1, wherein the memory is a ROM.

8. The memory of claim 1, wherein the memory is a programmable logic array (PLA).

9. A memory for storing a reorganized array of an initial array of binary data of ones and zeros, and flag data to enable decoding of the reorganized array to reproduce the information content of the initial array, the memory comprising:

a data circuit array having a plurality of memory cells for the reorganized array, the memory cells arranged in rows and columns;

logic circuitry to enable reading of the reorganized array from the memory to reproduce the information content of the initial array, the logic circuitry including a plurality of inverters, each inverter selectively coupled to one of the columns of the data circuit array responsive to the flag data; and output circuitry for reading the data from the data circuit array, and address circuitry for sequentially addressing memory cells to read data from the memory.

10. The memory of claim 9, further comprising:

a plurality of bit-lines for reading the data in the memory cells, each bit-line coupled to memory cells in one of the columns of the data circuit array, each memory cell storing a one has a transistor coupled to the bit-line.

11. The memory of claim 9, wherein the memory is a ROM.

12. The memory of claim 9, wherein the memory is a programmable logic array (PLA).

13. A computer comprising:

an input device;

an output device;

a memory for storing a reorganized array of an initial array of binary data of ones and zeros arranged in columns and rows, each row divided into one or more sections, and for storing flag data to enable decoding of the reorganized array to reproduce the information content of the initial array, the memory comprising:

a data circuit array having a plurality of memory cells for storing the reorganized array, the memory cells arranged in rows and columns;

logic circuitry coupled to the data circuit array to enable reading of the reorganized array from the memory to reproduce the information content of the initial array; and output circuitry for reading the data from the data circuit array; and address circuitry for sequentially addressing memory cells to read data from the memory.

14. The computer of claim 13, wherein the logic circuitry comprises:

a plurality of flag memory cells for storing the flag data, the flag memory cells arranged one or more columns and in rows, there being one column of flag memory cells for each section in one row of the initial array, such that each flag memory cell corresponds to one section of the row of the initial array; and a plurality of XOR gates, one XOR gate coupled to one column of the data circuit array and one column of the flag memory cells.

15. The computer of claim 14, wherein the logic circuit further comprises a plurality of inverters, each inverter selectively coupled to one of the columns of the data circuit array responsive to the flag data.

16. The computer of claim 13, wherein the logic circuit further comprises a plurality of inverters, each inverter selectively coupled to one of the columns of the data circuit array responsive to the flag data.

17. The computer of claim 13, wherein the output circuitry comprises:

a plurality of bit-lines for reading the data in the memory cells, each bit-line coupled to memory cells in one of the columns of the data circuit array, each memory cell storing a one has a transistor coupled to the bit-line;

one flag bit-line for each column of flag memory cells, each flag bit-line coupled to flag cells in one column of the flag memory cells for reading the flag data, each flag memory cell storing a one has a transistor coupled to the flag bit-line.

18. The computer of claim 13, wherein one section of one of the rows of the initial array consist of the number of bytes in a word of the memory.

19. The computer of claim 13, wherein one section of one of the rows of the initial array consist of the entire row of the initial array.

20. The computer of claim 13, wherein the memory is a ROM.

21. The computer of claim 13, wherein the memory is a programmable logic array (PLA).

22. A method for making a memory, the memory having a data circuit array of memory cells arranged in rows and columns for storing binary ones and zeros, output circuitry for reading binary data from the data circuit array, logic circuitry, and address circuitry for sequentially addressing memory cells to read data from the memory, the method comprising:

(a) providing an initial array of data represented by ones and zeros;

(b) encoding the initial array to provide a reorganized array in which there are fewer ones than zeros;

(c) recording flag data to enable decoding of the reorganized array to reproduce the information content of the initial array;

(d) storing the reorganized array in the data circuit array of the memory;

(e) storing the flag data in the logic circuitry in the memory; and (f) interconnecting the logic circuitry with the data circuit array and the output circuitry to enable reading data from the memory that corresponds to the data in the initial array.

23. The method of claim 22, wherein the encoding step includes the step of inverting the ones and zeros of each column of the initial array that has more ones than zeros, and the recording step includes the step of inverting the flag data for each column that has been inverted and recording the flag data.

24. The method of claim 23, wherein the encoding step further includes the step of inverting the ones and zeros of each row of the initial array that has at least as many zeros as ones, and the recording step further includes the step of inverting the flag data for each row that has been inverted and recording the flag data.

25. The method of claim 24, further comprising repeating the encoding and recording steps until each row and each column of the initial array have fewer ones than zeros, wherein whenever a row or column has been inverted an even number of times it is recorded as uninverted, and whenever a row or column has been inverted an odd number of times it is recorded as inverted.

26. The method of claim 25, wherein the logic circuitry comprises a plurality of inverters, one inverter coupled to one column recorded as inverted.

27. The method of claim 22, wherein the logic circuitry comprises a plurality of flag memory cells.

28. The method of claim 22, wherein the logic circuitry comprises a plurality of XOR gates, one XOR gate coupled to one column of the data circuit array and one column of the flag memory cells.

29. The method of claim 22, wherein the memory is a ROM.

30. The method of claim 22, wherein the memory is a programmable logic array (PLA).

31. A method for making a memory, the memory having a data circuit array of memory cells arranged in rows and columns for storing binary ones and zeros, output circuitry for reading binary data from the data circuit array, logic circuitry, and address circuitry for sequentially addressing memory cells to read data from the memory, the method comprising:

(a) providing an initial array of data represented by ones and zeros;

(b) dividing the initial array into one or more sections, such that each row in the initial array is divided into one or more sections;

(c) inverting the ones and zeros of each section of each row of the initial array that has more ones than zeros;

(d) inverting the flag data for each section of each row that has been inverted and recording the flag data to enable decoding of the reorganized array to reproduce the information content of the initial array;

(e) storing the reorganized array in the data circuit array of the memory;

(f) storing the flag data in the logic circuitry in the memory; and (g) interconnecting the logic circuitry with the data circuit array and the output circuitry to enable reading data from the memory that corresponds to the data in the initial array.

32. The method of claim 31, further including the steps of: inverting the ones and zeros of each column of the initial array that has more ones than zeros; and inverting the flag data for each column that has been inverted and recording the flag data to enable decoding of the reorganized array to reproduce the information content of the initial array the inverting and recording steps performed prior to storing the flag data in the logic circuitry in the memory.

33. The method of claim 32, further comprising repeating the inverting and recording steps until each section or each row and each column of the initial array have fewer ones than zeros, wherein whenever a row or column has been inverted an even number of times it is recorded as uninverted, and whenever a row or column has been inverted an odd number of times it is recorded as inverted.

34. The method of claim 33, wherein the logic circuitry comprises a plurality of inverters, one inverter coupled to one column recorded as inverted.

35. The method of claim 31, wherein the logic circuitry comprises a plurality of flag memory cells, one flag memory cell corresponding to one section of one row.

36. The method of claim 31, wherein the logic circuitry comprises a plurality of XOR gates, one XOR gate coupled to one column of the data circuit array and one column of the flag memory cells.

37. The method of claim 31, wherein the memory is a ROM.

38. The method of claim 31, wherein the memory is a programmable logic array (PLA).

39. The method of claim 31, wherein one section of one of the rows of the initial array consist of the number of bytes in a word of the memory.

40. The method of claim 31, wherein one section of one of the rows of the initial array consist of the entire row of the initial array.

41. The method of claim 31, wherein two of the datum in one of the sections of one of the rows of the initial array are separated by at least one datum not in the sane section of the row of the initial array.

42. A method of storing an initial array of data represented by ones and zeros in a memory in a logically reorganized array that preserves the information content of the initial array when read out from the memory, the memory including a data circuit array arranged in rows and columns, the data circuit array divided into one or more sections such that each row is divided into one or more sections, a plurality of memory cells defined at the intersection of each row and each column, a plurality of flag memory cells arranged in rows and at least one column having a flag bit line for each column of the flag memory cells, a word line for each data row for selectively interconnecting the data of each row of the memory with respective bit-lines and for selectively interconnecting the flag memory cells corresponding to row to the flag-bit line, a row of XOR gates, each XOR gate corresponding to a column, each XOR gate having the bit-line of the corresponding column of the data circuit array as first input and the flag bit-line as the second input, a row of inverters, each inverter corresponding to an XOR gate and being selectively connectable to the XOR gate, the method comprising:

(a) identifying the data represented by ones and zeros in data cells arranged in rows and columns in the initial array;

(b) identifying a row of column logic cells, each having an initial zero value and corresponding to a column of the initial array;

(c) dividing the initial array into one or more sections, such that each row of the initial array is divided into one or more sections;

(d) identifying one column of row logic cells for each section of the initial array, each having an initial zero value and corresponding to a section of a row of the initial array;

(e) for each section of each row of the initial array that has more data cells with ones than zeros, inverting the values of each data cell in the section of the row and the row logic cell corresponding to the section of the row;

(f) for each column of the initial array that has more data cells with ones than zeros, inverting the values of each data cell in the column and the column logic cell corresponding to the column;

(g) storing the values of the data cells of the initial array as data bits at corresponding locations in the reorganized array;

(h) storing the values of the data cells of the reorganized array in the memory cells of the data circuit array;

(i) storing the values of the row logic cells as flag bits at corresponding locations in the flag memory cells; and (j) coupling an inverter to each column of the data circuit array that stores a column of the second array that corresponds to a column logic cell that has one value.

43. The method of claim 42 in which steps (e) and (f) are repeated until each section of each row of the initial array has fewer data cells with ones than zeros and each column of the initial array has fewer data cells with ones than zeros.

44. The method of claim 42, wherein each inverter is selectively connected to the output of the XOR gate to invert the output of its corresponding XOR gate.

45. The method of claim 42 in which step (f) is performed prior to step (e), and each inverter is selectively connectable to the first input of the XOR gate to inverted the corresponding column of the data stored in the data circuit array prior to the XOR gate.

46. The method of claim 42, wherein the memory is a ROM.

47. The method of claim 42, wherein the memory is a programmable logic array (PLA).

48. The method of claim 42, wherein one section of one of the rows of the initial array consist of the number of bytes in a word of the memory.

49. The method of claim 42, wherein one section of one of the rows of the initial array consist of the entire row of the data circuit array.

50. The method of claim 42, wherein two of the datum in one of the sections of one of the rows of the initial array are separated by at least one datum not in the sane section of the row of the initial array.

* * * * *